(12) United States Patent
Liu

(10) Patent No.: US 7,639,592 B2
(45) Date of Patent: Dec. 29, 2009

(54) SYSTEM OF SAMPLING INTERFACE FOR AN OPTICAL PICK-UP HEAD

(76) Inventor: Chih-Min Liu, 8F, No. 533, Chung-Cheng Rd., Hsin-Tien (TW)

( * ) Notice: Subject to any disclaimer, the term of this patent is extended or adjusted under 35 U.S.C. 154(b) by 433 days.

(21) Appl. No.: 11/088,856

(22) Filed: Mar. 25, 2005

(65) Prior Publication Data

US 2006/0002282 A1 Jan. 5, 2006

(30) Foreign Application Priority Data

Jun. 30, 2004 (TW) .............................. 93119663 A

(51) Int. Cl.
*G11B 7/00* (2006.01)

(52) U.S. Cl. .......................... 369/124.05; 369/124.01; 369/44.34

(58) Field of Classification Search ................ 369/100, 369/124.01, 44.34
See application file for complete search history.

(56) References Cited

U.S. PATENT DOCUMENTS

| | | | | |
|---|---|---|---|---|
| 5,049,834 | A * | 9/1991 | Kasai | 330/255 |
| 5,214,327 | A * | 5/1993 | Saeki et al. | 326/38 |
| 5,499,212 | A * | 3/1996 | Amanai | 365/218 |
| 5,566,142 | A * | 10/1996 | Nakano et al. | 369/122 |
| 5,708,373 | A * | 1/1998 | Inoue | 326/88 |
| 5,786,711 | A * | 7/1998 | Choi | 326/83 |
| 6,215,749 | B1 * | 4/2001 | Kim | 369/124.13 |
| 2002/0084834 | A1 * | 7/2002 | Nakamura | 327/536 |
| 2003/0214841 | A9 * | 11/2003 | Scheuerlein et al. | 365/185.03 |

FOREIGN PATENT DOCUMENTS

WO      WO0241457  A1 *  5/2002

OTHER PUBLICATIONS

C. Kizilyalli et al MOS Transistors with stacked SiO2-Ta2O5-SiO2 Gate Dielectrics for Giga-Scale Intergration of CMOS Technologies Nov. 1998 IEEE Electron Devise Letters vol. 19, No. 11 3 pages.*
Kizilyalli et al MOS Transistors with Stacked SiO2-Ta2O5-SiO2 Gate Dielectrics for Giga-Scale Integration of CMOS Technologies Nov. 1998 IEEE Electron Device Letters, vol. 19, No. 11 pp. 423-425.*

* cited by examiner

*Primary Examiner*—Wayne R Young
*Assistant Examiner*—Adam R Giesy
(74) *Attorney, Agent, or Firm*—Perkins Coie LLP

(57) ABSTRACT

A system of sampling interface for an optical pick-up head comprises an optical pick-up head, a PMOS, a boost circuit, and a sample and hold circuit. The optical pick-up head outputs one of a reading voltage and a writing voltage. The PMOS gate receives the gate voltage and then the PMOS is turned on to pass the reading voltage to the sample and hold circuit. Moreover, the substrate of the PMOS receives a control voltage. The boost circuit is used to boost the gate voltage higher than the control voltage for turning off the PMOS and isolating the writing voltage.

32 Claims, 6 Drawing Sheets

SYSTEM OF SAMPLING INTERFACE FOR AN OPTICAL PICK-UP HEAD

RELATED APPLICATIONS

The present application is based on, and claims priority from, Taiwanese Application Number 093119663, filed Jun. 30, 2004, the disclosure of which is hereby incorporated by reference herein in its entirety.

BACKGROUND OF THE INVENTION

1. Field of the Invention

The present invention is generally related to an interface circuit system, and more particularly to a sampling interface circuit for providing the functions of signal sample and hold between the circuits with a different working voltage. And the interface circuit system could protect the circuits with a lower working voltage during the high voltage operation.

2. Description of the Prior Art

When a signal is transmitted from a circuit with a higher working voltage to a circuit with a lower working voltage, an interface circuit is necessary existed between the two circuits to weaken the signal within the voltage accepting range of the circuit with a lower working voltage. For example, the working voltage of a general optical pick-up head is at 5 volts, and the working voltage of an optical disk driver (CD-ROM) control chip is at 3.3 volts. If the writing voltage output by optical pick-up head is directly input into the CD-ROM control chip, the input end oxide layer of 3.3 volts process will collapse and the chip will become permanently damaged after long time stress.

A general CD-ROM control chip 100 as shown in FIG. 1, the optical pick-up head has a voltage input 101, the voltage input 101 could be either a writing voltage (between 3.3 volts and 5 volts) or reading voltage (between 1.4 volts and 2.8 volts). Using the voltage divider composed of the first voltage divider resistor 102 and the second voltage divider resistor 103 to weaken the writing voltage under 3.3 volts, that is the voltage accepting range of a CD-ROM control chip. The input end oxide layer of CD-ROM control chip 100 could avoid collapsing, because the writing voltage is controlled under 3 volts by the voltage divider.

The reading voltage produced by the voltage input 101 uses the input end of a CD-ROM control chip such as the switched operation amplifier (SOP) 104 to sample and hold signal to produce a voltage output 105 for the internal part of CD-ROM control chip.

The optical pick-up head has to supply additional current for the path "I" produced by the voltage divider, which consumes additional power and causes thermal noise. If the resistance of the resistor 102 and resistor 103 are larger and then the settling time of the input end of SOP is larger so that the sampling time reduces. The voltage divider weakens not only the writing voltage that is not for sampling but also the reading voltage that is for sampling. If the weakened reading voltage combines with the back end noise, then the signal noise rate (SNR) will be reduced. Besides, two resistors cover a large area of a chip.

SUMMARY OF THE INVENTION

According to above-mentioned, the prior art has to supply additional current to drive the resistor. The settling time of the SOP increases with the resistance, so that the sampling time is reduced. Furthermore, the writing voltage for sampling is weakened as well as the reading voltage.

The present invention uses P-TYPE metal oxide semiconductor device (PMOS) to read all regions of the reading voltage, reduce the load of optical pick-up head, enhance the signal noise rate, reduce the transition time, enhance the sampling time and get a better signal.

The present invention uses the PMOS to conserve the amount of the power consumed, reduce the chip size and consume thermal noise.

The present invention could be constructed by the common components of the general process so as to enhance the reliability.

A system of sampling interface for an optical pick-up head comprises an optical pick-up head, a PMOS, a boost circuit and a sample and hold circuit. The optical pick-up head outputs one of a reading voltage and a writing voltage; The PMOS comprises a first source/drain, a PMOS gate and a substrate. The first source/drain is for receiving one of a reading voltage and a writing voltage. The PMOS gate receives the gate voltage for turning on the path between the first source/drain and the second source/drain of the PMOS. The substrate receives a control voltage; The boost circuit connects with the PMOS gate for boosting the gate voltage higher than the control voltage and turning off the path between the first source/drain and the second source/drain so as to block the writing voltage; The sample and hold circuit connects with the second source/drain for sampling and holding the reading voltage.

Another system of sampling interface for an optical pick-up head comprises an optical pick-up head, a PMOS, a voltage regulation circuit and a sample and hold circuit. The optical pick-up head is for outputting one of a reading voltage and a writing voltage; the PMOS comprises a first source/drain, a PMOS gate and a substrate. The source/drain is for receiving one of a reading voltage and a writing voltage. The PMOS gate receives the gate voltage for turning on the path between said first source/drain and the second source/drain of said PMOS. The substrate connects with the first source/drain; the voltage regulation circuit connects with the PMOS gate. The voltage regulation circuit controls the PMOS by a sample signal to output the reading voltage and to block the writing voltage; and the sample and hold circuit samples the reading voltage of the second source/drain of the PMOS according to the sample signal.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1:
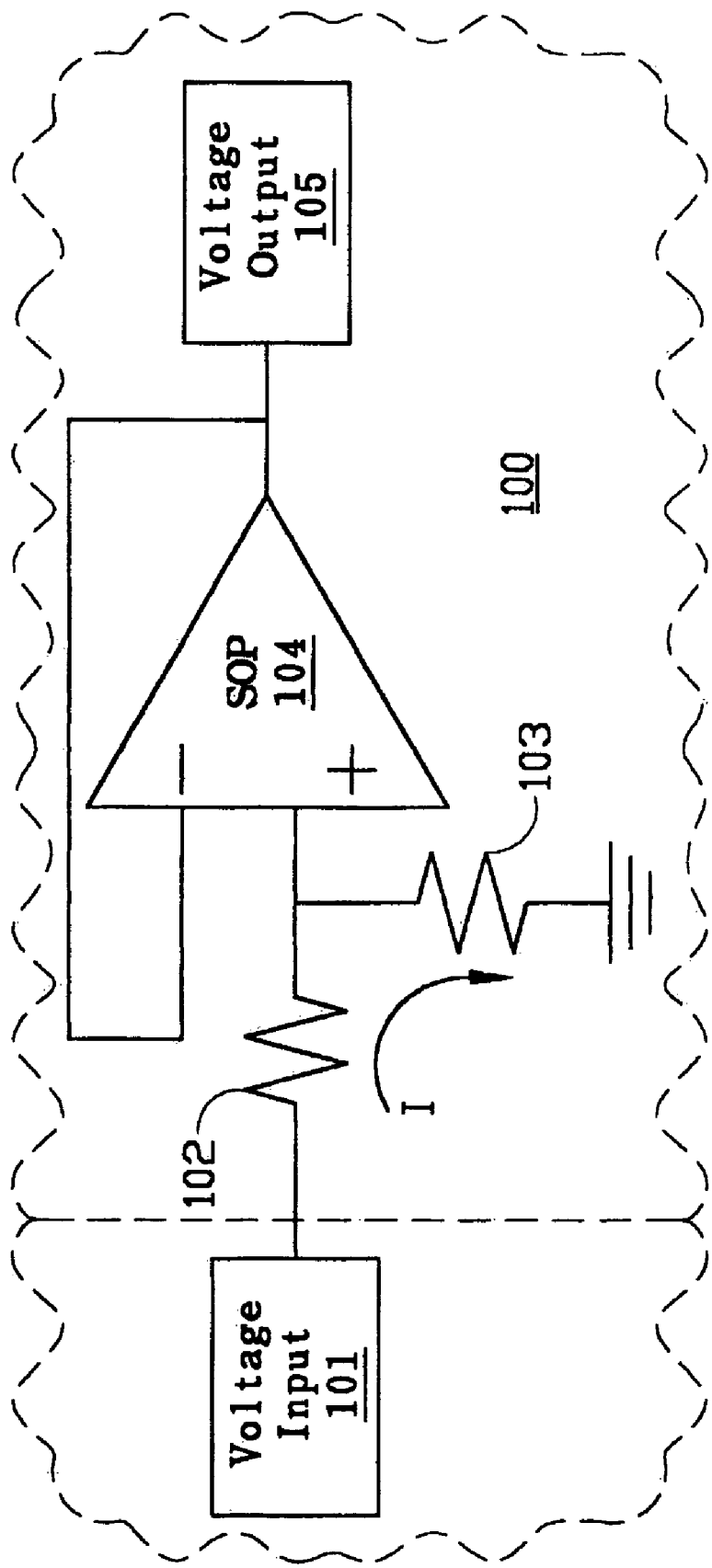
FIG. 1 is a schematic system of sampling interface for optical pick-up head in accordance with a conventional prior art.
Figure 2:
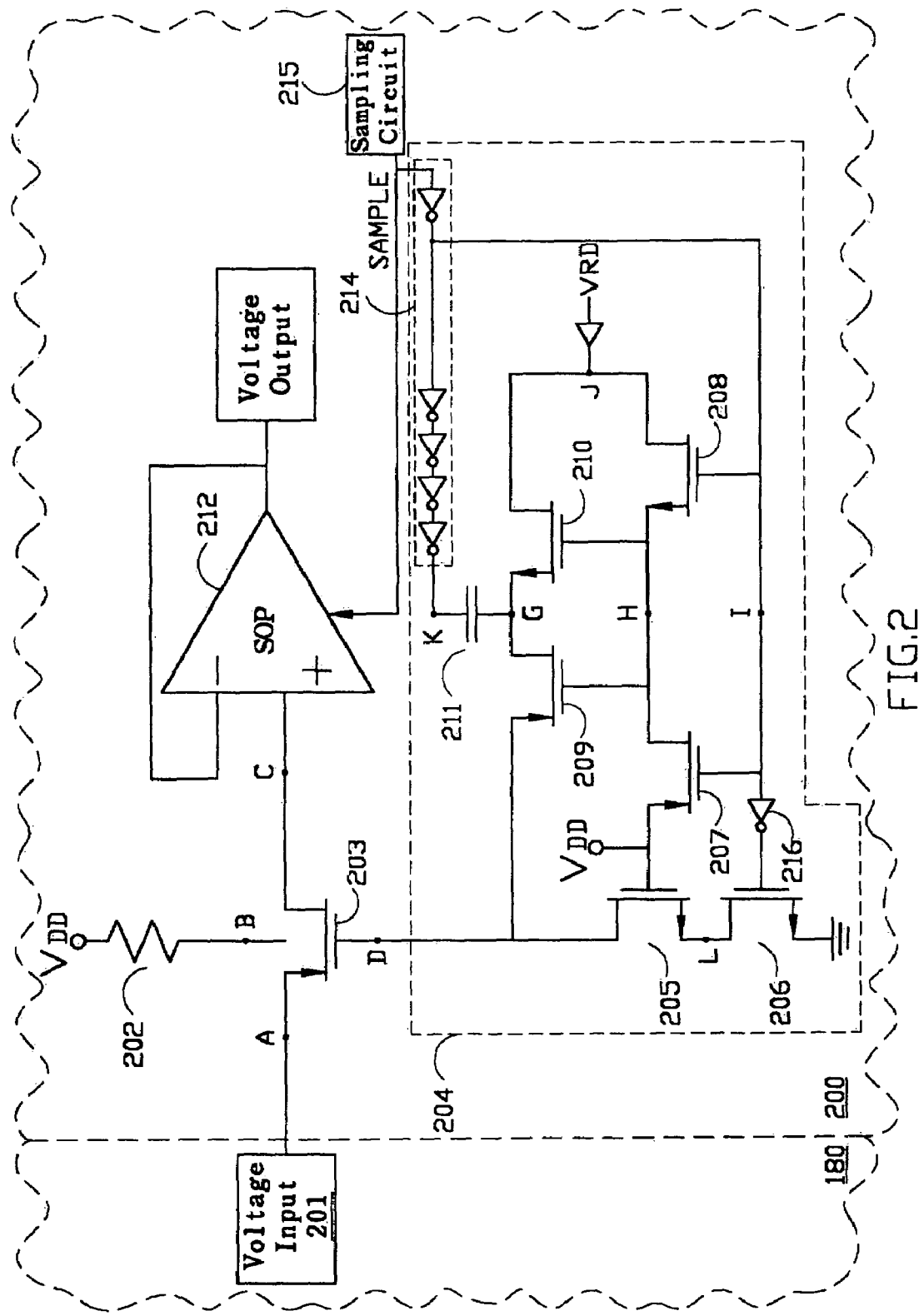
FIG. 2 is a schematic representation of preferred embodiment in accordance with the present invention.

Referring to FIG. 2 in accordance with an embodiment of the present invention, an optical pick-up head 180 outputs an input voltage 201 of one of a reading voltage (between 1.4 volts and 2.8 volts) and a writing voltage (between 3.3 volts and 5 volts). In the present embodiment, a PMOS 203 is placed between the optical pick-up head 180 and SOP 212 to receive the reading voltage or writing voltage, wherein the voltage input 201 alternately appears from the reading voltage or writing voltage. In order to prevent the front end of the control chip from collapsing by a high writing voltage, the present embodiment includes a PMOS 203, a resistor 202 and a boost circuit 204. When the reading voltage is input, the gate voltage from the gate "D" (at 3.3 volts) turns on the path between two ends of the PMOS 203, the first source/drain "A" and the second source/drain "C". Thus the SOP 212 is connected with the second source/drain "C" which could sample the reading voltage and the SOP 212 could receive all regions of the reading voltage (1.4 volts to 2.8 volts).

If the voltage input such as the writing voltage is too high, the voltage of the second source/drain "C" must be controlled under the working voltage of the control chip, hence the oxide layer of the internal input component of the CD-ROM control chip 200 is prevented from collapsing.

At the same time, when a high writing voltage is input (for example, 5 volts), a PN Junction is formed between the first source/drain "A" and the substrate "B" so that the voltage of the substrate "B" would be drived to 4.3 volts (5−Vt; Vt is the threshold voltage of the PMOS and Vt is at 0.7 volts). A resistor 202 is added into the substrate "B", in order to limit the current flowing into the $V_{DD}$ (at 3.3 volts) when the substrate "B" is drived to 4.3 volts. One end of the resistor 202 connects the substrate "B" of the PMOS 203, and the other end of the resistor 202 connects with the working voltage of the $V_{DD}$ on the control chip. For example, when the resistance of the resistor 202 is 20 K ohm, the current flowing into the resistor 202 is equal to (4.3−3.3)/20000=50 μA.

Limiting the current needs a larger resistance, but the resistance is better from 10 K ohm to 40 K ohm. In the situation that the voltage of the substrate "B" is 4.3 volts and is higher than the voltage of the gate "D" (at 3.3 volts), the PMOS 203 is still turned on, thus the first source/drain still transmits the writing voltage to the second source/drain "C" and the high writing voltage is not blocked. Hence, we use a boost circuit connected with the PMOS 203 gate to boost the voltage of the gate "D" which is higher than the control voltage of substrate "B". Therefore, keeping the potential difference between "D" and other nodes is not over the $V_{DD}$ to ensure the stability of the internal components.

The boost circuit 204 comprises a signal inverting circuit 214, a capacitor 211 and a logic circuit. The signal inverting circuit 214 comprises a plurality of inverters, the input end of the signal inverting circuit 214 receives the sample signal (SAMPLE), the output end of the signal inverting circuit 214 connects with one end K of the capacitor 211. The logic circuit comprises the N-TYPE metal oxide semiconductor device (NMOS) 205, the NMOS 206, the PMOS 209, the NMOS 210, the PMOS 207, the NMOS 208 and inverter 216. The NMOS 205 serial connects with the NMOS 206 between the PMOS 203 gate and a low level voltage (such as a ground voltage). The PMOS 209 connects the PMOS 203 gate and the other end "G" of the capacitor 211. The NMOS 210 connects the other end "G" of the capacitor 211 and the reference voltage VRD. The NMOS 210 gate connects with the PMOS 209 gate. The PMOS 207 connects the NMOS 205 gate (receiving a high level voltage $V_{DD}$ at the same time) and the PMOS 209 gate. The NMOS 208 connects the PMOS 209 gate and the reference voltage VRD. The PMOS 207 and the NMOS 208 gate receive an inverted sample signal. The input end of the inverter 216 receives an inverted sample signal and the output end of the inverter 216 connects with the NMOS 206 gate.

In the operation, the signal inverting circuit 214 receives the sample signal (SAMPLE) provided by the sample circuit 215 to produce an inverted sample signal. And then the inverted sample signal is output to one end K of the capacitor 211 and input end "I" of the inverter 216. When SAMPLE=1, that means the circuit is sampling. If the logic states of point "I" and point "K" are at 0 volts, the NMOS 208 turns off. When the PMOS 207 turns on, the point "H" becomes high level voltage due to the $V_{DD}$, so that the NMOS 210 turns on and the reference voltage VRD (at 1.5 volts) is provided for the other end "G" of the capacitor. Thus the potential difference is 1.5 volts between the two different ends of the capacitor 211, point "K" and point "G". At the same time, the inverted sample signal (logic state is 0) input to point "I" pass through the inverter 216 to turn on the NMOS 206. Moreover, the NMOS 205 turns on because the NMOS 205 gate connects with a $V_{DD}$. Thus the PMOS 203 gate "D" gets a low level voltage so that the PMOS 203 also turns on. According to above discussion, if the voltage input is reading voltage, the condition that SAMPLE=1 ensures that the reading voltage could be input into the SOP 212. Besides, the PMOS 209 turns off because the point "H" becomes high level voltage due to $V_{DD}$, thus the potential difference (at 1.5 volts) in the capacitor 211 could be preserved and would not disappear due to discharge.

When the SAMPLE=0, the logic states of point "I" and point "K" are 1, that means the voltage of point "I" and point "K" are risen to 3.3 volts. And the working voltage of the control chip is also at 3.3 volts. The voltage of point "G" is equal to 3.3 volts plus 1.5 volts stored in the capacitor 211 according to the characteristic of capacitors. So the voltage of the point "G" is at 4.8 volts. Because the NMOS 208 and the PMOS 209 is turned on and the voltage of the point "D" is at 4.8 volts, the PMOS 203 turns off and the voltage of point "C" is kept. Besides, the SOP 212 doesn't sample because the SAMPLE=0. When the SAMPLE=0, the voltage of each node is illustrated as follow: V(D)=V(G)=4.8 volts, V(J)=V(H)=1.5 volts, V(L)=3.3−0.7=2.6 volts, V(B)=4.3 volts. Because all the potential difference between the neighboring node is lower than 3.3 volts, the problem in the processing reliability is solved.

Figure 3:
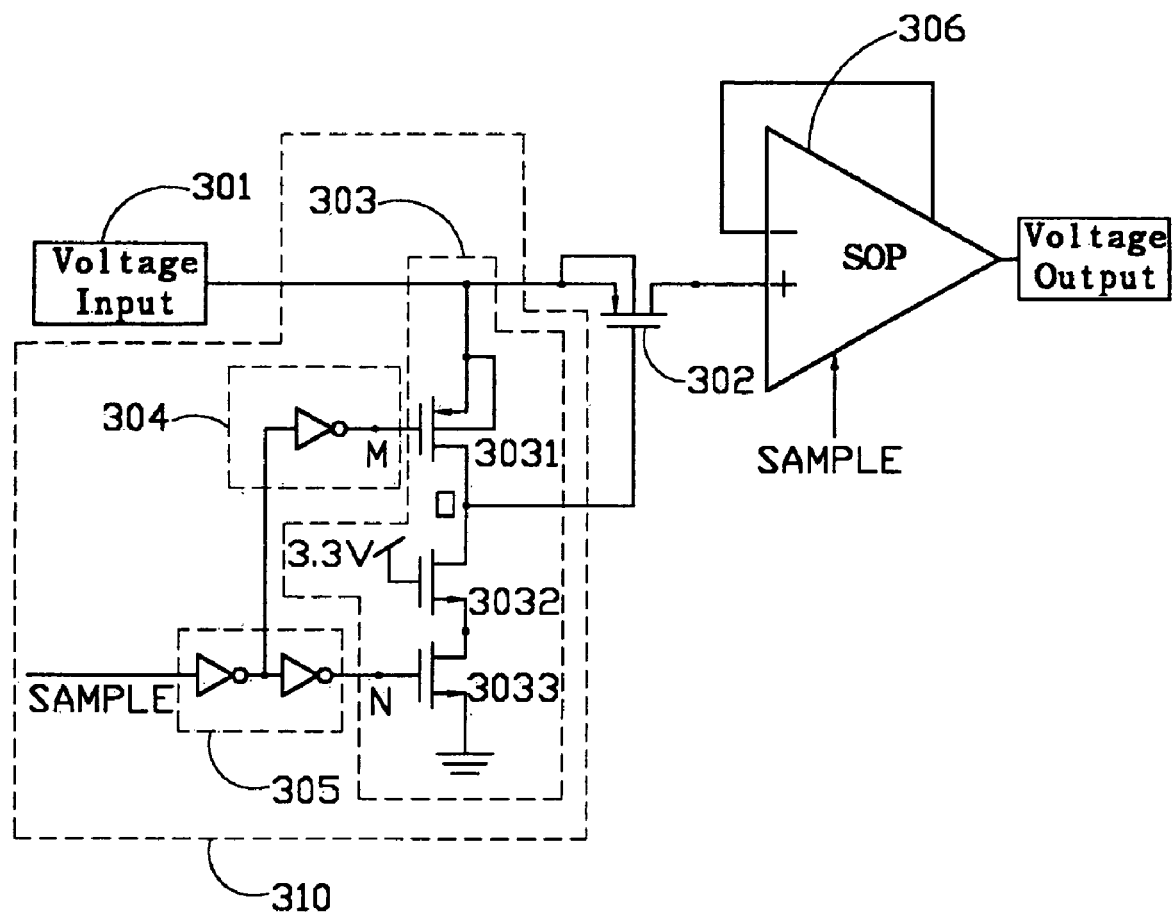
FIG. 3 is a schematic representation of another preferred embodiment in accordance with the present invention.

Referring to FIG. 2, the high level voltage is input into the PMOS gate to turn off the PMOS so as to block the writing voltage. We use the writing voltage to produce the high level voltage which is applied on the PMOS gate. Thus the above mentioned circuit could be further simplified and reach the same performance of isolation. Referring to FIG. 3 in accordance with another embodiment of the present invention, a PMOS 302 is placed between the optical pick-up head (not illustrated) and SOP to receive the reading voltage and writing voltage. The PMOS 302 also outputs a reading voltage to be received by the SOP. This embodiment comprises the voltage input 301 of the optical pick-up head, a PMOS 302, a voltage regulation circuit 310 and a SOP 306. Wherein the design of the voltage regulation circuit 310 comprises a signal inverting circuit 305, a control circuit 304 and a gate voltage outputting circuit 303. Moreover, the signal inverting circuit 305 uses a plurality of inverters to produce an inverted sample signal and to output the sample signal. The control circuit 304 is an inverter, the input end of the control circuit 304 receives the inverted sample signal and the output end of the control circuit 304 produces a control signal at point "M". The gate voltage outputting circuit 303 receives the sample signal and the control signal to produce the gate voltage at point "O". The gate voltage outputting circuit 303 is constructed by serial connecting the control PMOS 3031 and the NMOS 3032 and the NMOS 3033. The control PMOS 3031 gate receives the control signal, the source and substrate of the control PMOS 3031 connects with the first source/drain of the PMOS 302, the drain of the control PMOS 3031 connects with the PMOS 302 gate and the drain of the NMOS 3032. The NMOS 3032 gate connects with a high level voltage (at 3.3 volts), and the source of the NMOS 3032 connects with the drain of the NMOS 3033, the NMOS 3033 gate receives the sample signal from the point "N", the source of the NMOS 3033 connects with a low level voltage (such as ground voltage). The operation of the circuit is described as follows:

When SAMPLE=1, the logic states of the points "M" and "N" are 1 (at 3.3 volts) in accordance with the control circuit 304 and the signal inverting circuit 305, respectively. Then the PMOS 3031 turns off and the NMOS 3033 turns on so that the point "O" grounds and the PMOS 302 turns on. If SAMPLE=0 (for turning off the PMOS 302 in order to block the writing voltage), the logic state of the point "M" around the signal inverting circuit 305 and the point "N" around the control circuit 304 are 0. Then the PMOS 3031 turns on and the NMOS 3033 turns off so that the point "O" is equal to the voltage input 301. Furthermore, the situation of SAMPLE=0 means that the voltage input 301 is a writing voltage, which belongs to a high level voltage, so that the PMOS 302 turns off. According to the above mentioned, the voltages of the substrate and source and gate of the PMOS 302 are the same, hence, the problems in the processing reliability does not exist. Moreover, the purpose of the NMOS 3032 is to protect the NMOS 3033. When the high level voltage inputs, the voltage output of the source of the NMOS 3032 could be ensured that the voltage is under 3.3 minus Vt.

Figure 4:
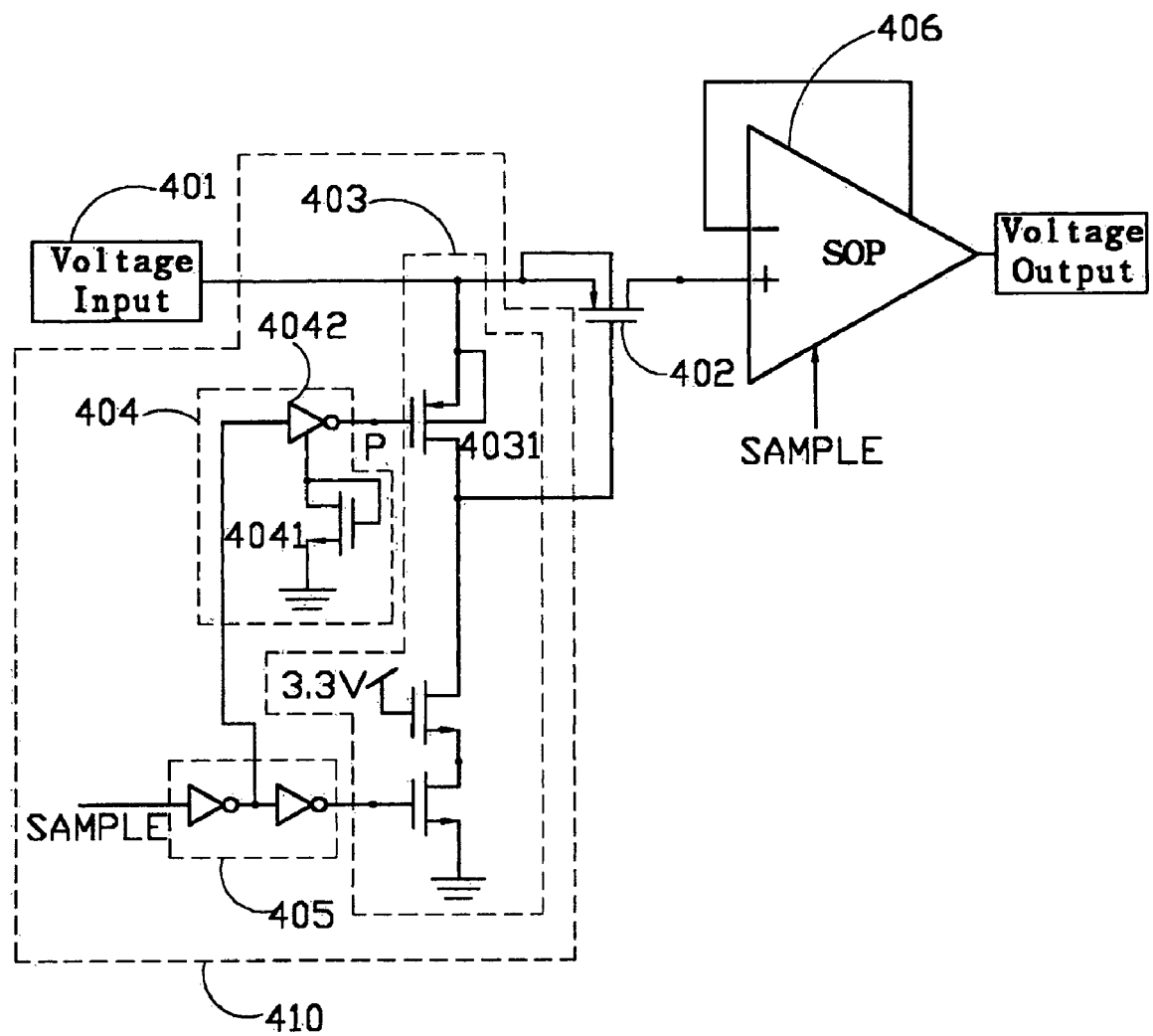
FIG. 4 is a schematic representation of another preferred embodiment in accordance with the present invention.

Referring to FIG. 4 in accordance with another embodiment of present invention, a PMOS 402 is placed between the optical pick-up head (not illustrated) and the SOP to receive the reading voltage and writing voltage. Besides, the PMOS 402 outputs a reading voltage for receiving by the SOP. The present embodiment comprises a voltage input 401 of the optical pick-up head, a PMOS 402, a voltage regulation circuit 410 and a SOP 406. Wherein the voltage regulation circuit 410 comprises a signal inverting circuit 405, a control circuit 404 and a gate voltage outputting circuit 403. The structure and function of the signal inverting circuit 405 and gate voltage outputting circuit 403 are the same with the circuits in FIG. 3. But the control circuit 404 is not the same as the one in the FIG. 3. The control circuit 404 comprises an inverter 4042 and the NMOS 4041. The inverter receives an inverted sample signal and the NMOS 4041 outputs a control signal. The source and gate of the NMOS 4041 connect with the inverter and then the drain of the NMOS 4041 connects with a low level voltage (for example, ground voltage). The operation of the circuit is described as follows:

The operation of the present embodiment is almost the same with the one in FIG. 3 exclusive of the control circuit 404.

In the present embodiment, to the NMOS (not illustrated) end of the inverter 4042 in the control circuit 404 could be added an additional NMOS 4041, so that the voltage of the point "P" would not be lower than the 0 voltage and the voltage of the substrate and the source of the PMOS 4031 would not be over 3.3 volts.

Besides, the NMOS end of the inverter 4042 may connects 1 to 3 NMOS in serial. And the method of connection could be a diode connection type, so that the high level voltage of the point "P" could be at 3.3 volts and the low level voltage of the point "P" could be in the range between 1 and 1.7 volts, and then the PMOS 4031 would not be damaged.

Figure 5:
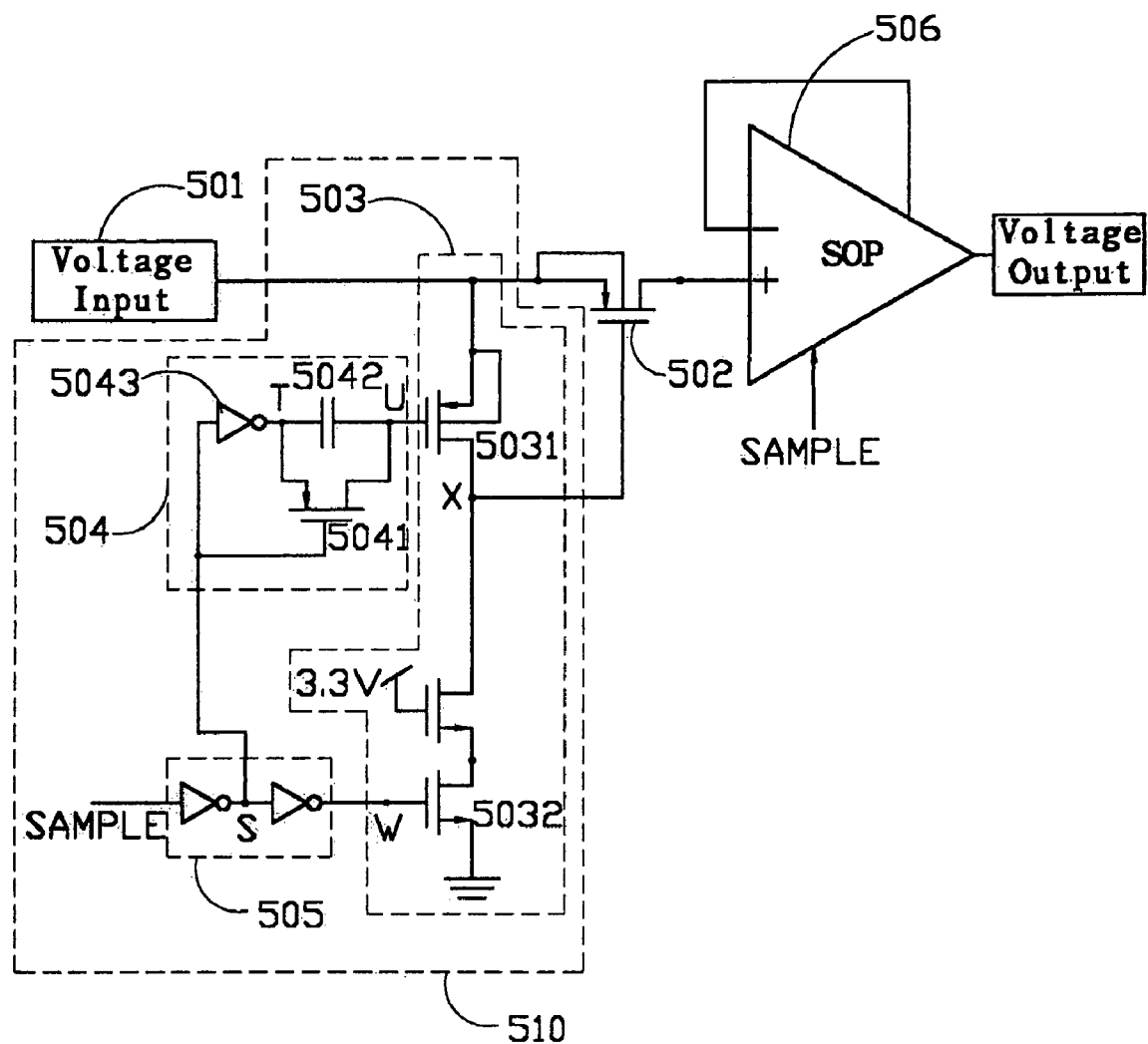
FIG. 5 is a schematic representation of another preferred embodiment in accordance with the present invention.

Referring to FIG. 5 in accordance with another embodiment of present invention, a PMOS 502 is placed between the optical pick-up head (not illustrated) and the SOP to receive the reading voltage and writing voltage. Besides, the PMOS 502 outputs a reading voltage to be received by the SOP. The present embodiment comprises a voltage input 501 of the optical pick-up head, a PMOS 502, a voltage regulation circuit 510 and a SOP 506. Wherein the voltage regulation circuit 510 comprises a signal inverting circuit 505, a control circuit 504 and a gate voltage outputting circuit 503. The structure and function of both the signal inverting circuit 505 and the gate voltage outputting circuit 503 are the same with the circuits in FIG. 3. But the control circuit 504 is not the same with the one in FIG. 3. The control circuit 504 comprises an inverter 5043, the PMOS 5041 and a capacitor 5042. The inverter 5043 and the PMOS 5041 gate receive the inverted sample signal at the same time. One end of the capacitor 5042 connects with the output end of the inverter 5043 and the source of the PMOS 5041. The other end of the capacitor 5042 connects the drain of the PMOS 5041 and the PMOS 5031 gate. The operation of the circuit is described as follows:

The operation of this embodiment is similar as that in FIG. 3. When SAMPLE=1, then the point "S" is equal to 1 and the PMOS 5041 turns on. T=U=W=3.3 volts. The PMOS 5031 turns off and the NMOS 5032 turns on. The voltage of point "X" is equal to 0 volts and the PMOS 502 turns on. When SAMPLE=0, the voltage of the point "S" is equal to 1 and the PMOS 5041 turns off. T=W=0 volts, and the point "U" is sharply equal to 0 volt. The PMOS 5031 turns on and the NMOS 5032 turns off. The voltage of point "X" inputs the PMOS 502 gate and then the PMOS 502 turns off.

When SAMPLE=0, the point "U" is sharply equal to 0 volts due to the potential difference continuity between the two ends of the capacitor 5042. The PMOS 502 could also turn off without delay because the PMOS 5031 turns on instantaneously. Moreover, once the voltage of the point "X" increases, then the voltage of point "U" also increases. The voltage of point "U" is the partial pressure between the point "T" and point "X". The voltage of the point "U" could be steady state by adjusting the capacitor ratio.

The increasing of the voltage of the point "X" won't cause a problem in the processing reliability.

Besides, The used components in this embodiment are general components, furthermore, the size and amount of power consumed of these used components are smaller so that using these components could reduce problems during the manufacturing process.

Figure 6:
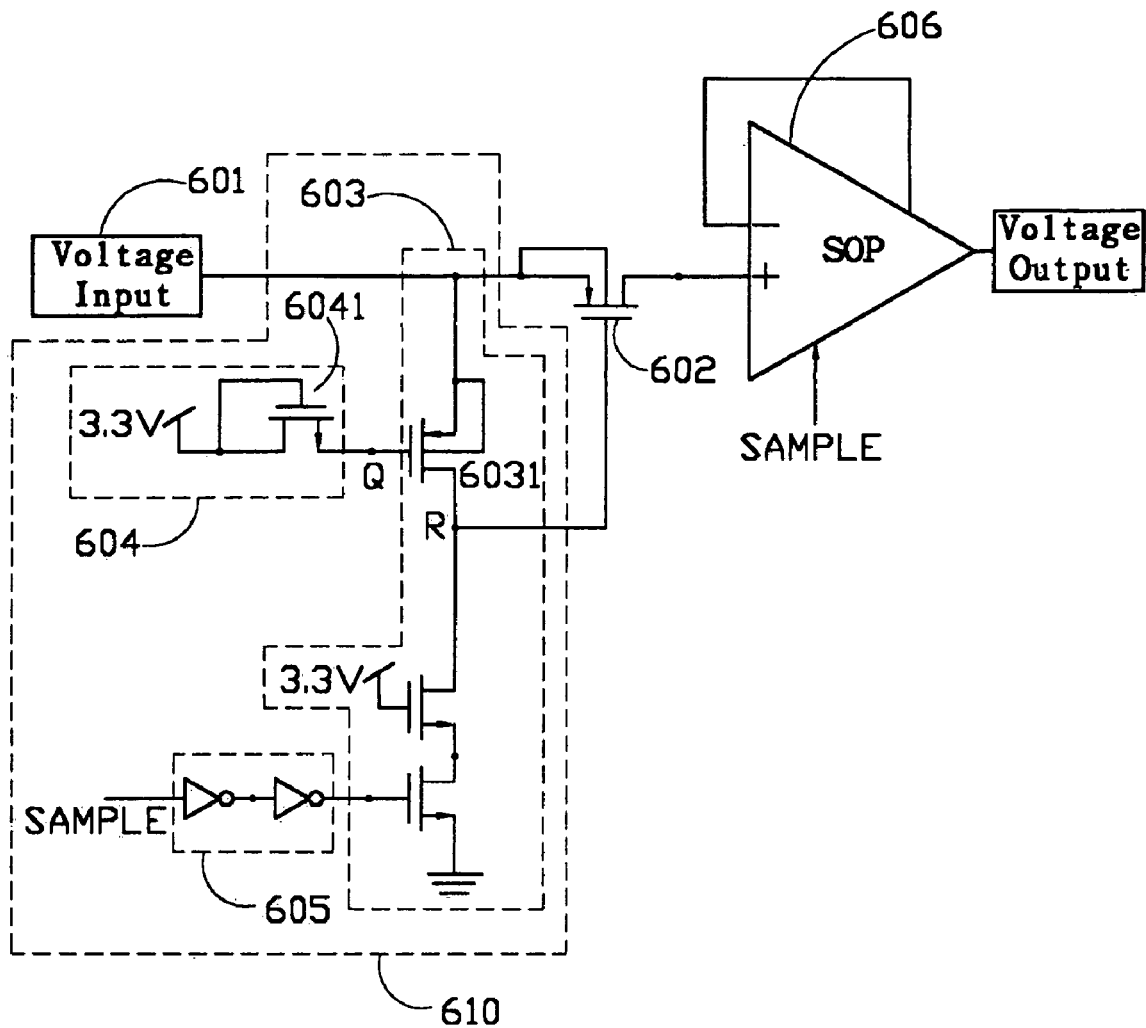
FIG. 6 is a schematic representation of another preferred embodiment in accordance with the present invention.

Referring to FIG. 6 in accordance with another embodiment of the present invention, a PMOS 602 is placed between the optical pick-up head (not illustrated) and the SOP to receive the reading voltage and writing voltage. Besides, the PMOS 602 outputs a reading voltage to be received by the SOP. The present embodiment comprises a voltage input 601 of the optical pick-up head, a PMOS 602, a voltage regulation circuit 610 and a SOP 606. Wherein the voltage regulation circuit 610 comprises a control circuit 604, a gate voltage outputting circuit 603 and a buffer 605. The structure and function of the gate voltage outputting circuit 603 are the same with the circuits in FIG. 3. And the structure of the buffer 605 is the same with the signal inverting circuit 305 (composed by a plurality of inverters). The present embodiment doesn't produce the inverted sample signal, but the sample signal is delayed to output to the gate voltage outputting circuit. Besides, the control circuit 604 comprises a NMOS 6041, wherein the gate and source of the NMOS 6041 connects with a high level voltage (for example, 3.3 volts) and the source of the NMOS 6041 produces a control signal at the point "Q". The operation of the circuit is described as follows:

The operation of the present embodiment is the same with the circuit in FIG. 3 exclusive of connected method of the NMOS 6041. The control circuit 604, which is diode-connected, connects with the working voltage of the control chip. The working voltage is at 3.3 volts in the present embodiment and the voltage of the point "Q" is equal to 3.3 minus Vt. When the source voltage of the PMOS 6031 is one Vt greater than the gate voltage (point "Q"), the PMOS 6031 turns on. Once the voltage input minus the voltage of the point "Q" is greater than Vt, in other words, the voltage input is greater than at 3.3 volts, and then the PMOS 6031 turns on and the PMOS 602 turns off.

Although specific embodiments have been illustrated and described, it will be obvious to those skilled in the art that various modifications may be made without departing from what is intended to be limited solely by the appended claims.

What is claimed is:

1. An interface for an optical pick-up head configured to output one of a reading voltage or a writing voltage, said interface comprising:
    a first P-TYPE Metal Oxide Semiconductor device (PMOS) comprising a first source/drain, a first PMOS gate and a substrate, wherein said first source/drain is configured to receive one of said reading voltage or said writing voltage, and said first PMOS gate is configured to receive a gate voltage for turning on a path between said first source/drain of said first PMOS and a second source/drain of said first PMOS, and said substrate is configured to receive a control voltage;
    a boost circuit connectable with said first PMOS gate and configured to boost said gate voltage greater than said control voltage and turn off a path between said first source/drain and said second source/drain so as to block said writing voltage; and
    a sample and hold circuit connectable with said second source/drain and configured to sample and hold said reading voltage so that when the said writing voltage is blocked, said sample and hold circuit can supply said reading voltage to a control chip.

2. The interface according to claim 1, wherein said writing voltage is greater than said reading voltage.

3. The interface according to claim 1, wherein said writing voltage is at 3.5 volts to 5 volts and said reading voltage is at 1.4 volts to 2.8 volts.

4. The interface according to claim 1, wherein said interface further comprises a resistor, and one end of said resistor connects with said substrate, and the other end of said resistor receives working voltage.

5. The interface according to claim 4, wherein said working voltage is at 3.3 volts.

6. The interface according to claim 1, wherein said interface further comprises a sample circuit, and wherein said sample circuit produces a sample signal according to said reading voltage and said writing voltage, and said sample signal is for controlling said sample circuit to sample and controlling said boost circuit to block said writing voltage.

7. The interface according to claim 6, wherein said boost circuit boosts said gate voltage of said first PMOS higher than said controlling voltage by utilizing said sample signal to control a capacitor.

8. The interface according to claim 7, wherein said boost circuit further comprises a signal inverting circuit and a logic circuit, and wherein said signal inverting circuit receives said sample signal and produces an inverted sample signal to one end of said capacitor, and said logic circuit connects with the other end of said capacitor and said first PMOS gate, and said logic circuit receives a reference voltage and said inverted sample signal.

9. The interface according to claim 8, wherein said logic circuit further comprises a first N-TYPE Metal Oxide Semiconductor device (NMOS), a second NMOS, a third NMOS, a fourth NMOS, a second PMOS and a third PMOS, and wherein said first NMOS and said second NMOS are serial connected between said first PMOS gate and a low voltage, and said second PMOS connects with said first PMOS gate and one end of said capacitor, and said third NMOS connects with the other end of said capacitor and said reference voltage, and a third NMOS gate connects with a second PMOS gate, and said third PMOS connects with said first NMOS gate and said second PMOS gate, and said fourth NMOS connects with said second PMOS gate and said reference voltage, and a third PMOS gate and a fourth NMOS gate receive said inverted sample signal, and an input end of an inverter receives said inverted sample signal and an output end of said inverter connects with said second NMOS gate.

10. The interface according to claim 1, wherein said sample and hold circuit is a switched operational amplifier (SOP).

11. An interface for an optical pick-up head configured to output one of a reading voltage and a writing voltage, said interface comprising:
    a first PMOS comprising a first source/drain, a first PMOS gate and a substrate, and wherein said first source/drain is configured to receive one of said reading voltage and said writing voltage, and said first PMOS gate is configured to receive a gate voltage for turning on a path between said first source/drain and a second source/drain of said first PMOS, and said substrate electrically coupled to said first source/drain;
    a voltage regulation circuit electrically coupled to said first PMOS gate, wherein said voltage regulation circuit controls said first PMOS by a sample signal to output said reading voltage and block said writing voltage, the voltage regulation circuit comprising:
        a signal inverting circuit for receiving said sample signal to produce an inverted sample signal, and then to output a twice-inverted sample signal;
        a control circuit for receiving said inverted sample signal and producing a control signal; and
        a gate voltage outputting circuit for receiving said twice-inverted sample signal and said control signal, and then to produce said gate voltage; and
    a sample and hold circuit configured to sample said reading voltage of said second source/drain according to said sample signal.

12. The interface according to claim 11, wherein said signal inverting circuit comprises a plurality of inverters.

13. The interface according to claim 11, wherein said gate voltage outputting circuit comprises a control PMOS, a first NMOS and a second NMOS, and wherein a control PMOS gate receives said control signal, and a source and a substrate of said control PMOS connect with said first source/drain, and a drain of said control PMOS connects with first PMOS gate and a drain of the first NMOS, and a first NMOS gate connects with a high level voltage, and a source of said first NMOS connects with a drain of the second NMOS, and a second NMOS gate receives said twice-inverted sample signal, and a source of said second NMOS connects with a low level voltage.

14. The interface according to claim 11, wherein said control circuit is an inverter.

15. The interface according to claim 11, wherein said control circuit comprises an inverter and a third NMQS, and wherein said inverter receives said inverted sample signal and said third NMOS outputs said control signal, and a drain and a gate of said third NMOS connect with said inverter, and a source of said third NMOS connects with a low level voltage.

16. The interface according to claim 11, wherein said control circuit comprises said inverter, a third PMOS and a capacitor, and wherein said inverter and a third PMOS gate receive said inverted sample signal, and one end of said capacitor connects with an output end of said inverter and a source of said third PMOS, and the other end of said capacitor connects with a drain of said third PMOS and said first PMOS gate.

17. The interface according to claim 11, wherein said voltage regulation circuit comprises:
 said control circuit for receiving a high level voltage to produce said control signal;
 said gate voltage outputting circuit for receiving said twice-inverted sample signal and said control signal to produce said gate voltage; and
 a buffer for receiving said twice-inverted sample signal, and delaying said twice-inverted sample signal to output to said gate voltage outputting circuit.

18. The interface according to claim 17, wherein said control circuit comprises a NMOS, and a gate and a drain of said NMOS connect with said high level voltage, and said drain of said NMOS produces said control signal.

19. The interface according to claim 17, wherein said buffer comprises a plurality of inverters.

20. The interface according to claim 17, wherein said gate voltage outputting circuit comprises a control PMOS, a first NMOS and a second NMOS, and a control PMOS gate receives said control signal, and a source and a substrate of said control PMOS connect with said first source/drain, and a drain of said control PMOS connects with first PMOS gate and a drain of the first NMOS, and a first NMOS gate connects with a high level voltage, and a source of said first NMOS connects with a drain of the second NMOS, and a second NMOS gate receives said twice-inverted sample signal, and a source of said second NMOS connects with a low level voltage.

21. The interface according to claim 11, wherein said writing voltage is higher than reading voltage.

22. An interface for an optical pick-up head configured to output one of a reading voltage and a writing voltage, said interface comprising:
 sampling means for sampling said reading voltage according to a sample signal; and
 voltage supplying means for supplying a gate voltage that results in turning on a path between said optical pick-up head and said sampling means when the optical pick-up head is outputting said reading voltage, and for supplying a gate voltage that results in turning off a path between said optical pick-up head and said sampling means when the optical pick-up head is outputting said writing voltage, the voltage supplying means comprising:
  means for receiving said sample signal to produce an inverted sample signal, and then to output a twice-inverted sample signal;
  means for receiving said inverted sample signal and producing a control signal; and
  means for generating said gate voltage based on the sample signal and the control signal.

23. The interface according to claim 22, wherein said means for receiving said sample signal to produce an inverted sample signal comprises a plurality of inverters.

24. The interface according to claim 22, wherein said means for generating said gate voltage comprises a control PMOS, a first NMOS and a second NMOS, and wherein a control PMOS gate receives said control signal, and a source and a substrate of said control PMOS is electrically coupled to said first source/drain, and a drain of said control PMOS is electrically coupled to first PMOS gate and a drain of the first NMOS, and a first NMOS gate is electrically coupled to a high level voltage, and a source of said first NMOS is electrically coupled to a drain of the second NMOS, and a second NMOS gate receives said twice-inverted sample signal, and a source of said second NMOS is electrically coupled to a low level voltage.

25. The interface according to claim 22, wherein said means for receiving said inverted sample signal and producing a control signal is an inverter.

26. The interface according to claim 22, wherein said means for receiving said inverted sample signal and producing a control signal comprises an inverter and a third NMOS, and wherein said inverter receives said inverted sample signal and said third NMOS outputs said control signal, and a drain and a gate of said third NMOS is electrically coupled to said inverter, and a source of said third NMOS is electrically coupled to a low level voltage.

27. The interface according to claim 23, wherein said means for receiving said inverted sample signal and producing a control signal comprises said inverter, a third PMOS and a capacitor, and wherein said inverter and a third PMOS gate receive said inverted sample signal, and one end of said capacitor is electrically coupled to an output end of said inverter and a source of said third PMOS, and the other end of said capacitor is electrically coupled to a drain of said third PMOS and said first PMOS gate.

28. The interface according to claim 22, wherein said voltage supplying means comprises:
 a means for receiving a high level voltage to produce said control signal;
 a means for receiving said twice-inverted sample signal and said control signal to produce said gate voltage; and
 a means for receiving said sample signal, and delaying said sample signal to output to the means for generating the control voltage.

29. The interface according to claim 28, wherein said means for receiving said inverted sample signal and producing a control signal comprises a NMOS, and a gate and a drain of said NMOS is electrically coupled to said high level voltage, and said drain of said NMOS produces said control signal.

30. The interface according to claim 28, wherein said means for receiving said sample signal, and delaying said sample signal comprises a plurality of inverters.

31. The interface according to claim 28, wherein said means for generating said control voltage comprises a control PMOS, a first NMOS and a second NMOS, and a control PMOS gate receives said control signal, and a source and a substrate of said control PMOS is electrically coupled to said first source/drain, and a drain of said control PMOS is electrically coupled to first PMOS gate and a drain of the first NMOS, and a first NMOS gate is electrically coupled to a high level voltage, and a source of said first NMOS is electrically coupled to a drain of the second NMOS, and a second NMOS gate receives said twice-inverted sample signal, and a source of said second NMOS is electrically coupled to a low level voltage.

32. The interface according to claim 22, wherein said writing voltage is higher than reading voltage.

* * * * *

UNITED STATES PATENT AND TRADEMARK OFFICE
CERTIFICATE OF CORRECTION

PATENT NO. : 7,639,592 B2  Page 1 of 1
APPLICATION NO. : 11/088856
DATED : December 29, 2009
INVENTOR(S) : Chih-Min Liu It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 673 days.

Signed and Sealed this

Ninth Day of November, 2010

David J. Kappos
*Director of the United States Patent and Trademark Office*